(12) United States Patent
Lee

(10) Patent No.: US 11,521,982 B2
(45) Date of Patent: Dec. 6, 2022

(54) THREE-DIMENSIONAL SEMICONDUCTOR DEVICE HAVING DEPOSITION INHIBITING PATTERNS

(71) Applicant: SK hynix Inc., Gyeonggi-do (KR)

(72) Inventor: Young Jin Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 193 days.

(21) Appl. No.: 16/423,788

(22) Filed: May 28, 2019

(65) Prior Publication Data

US 2019/0280009 A1    Sep. 12, 2019

Related U.S. Application Data

(62) Division of application No. 15/687,131, filed on Aug. 25, 2017, now Pat. No. 10,347,651, which is a division of application No. 14/980,244, filed on Dec. 28, 2015, now Pat. No. 9,780,114.

(30) Foreign Application Priority Data

Jul. 22, 2015    (KR) .................... 10-2015-0103965

(51) Int. Cl.
| | | |
|---|---|---|
| *H01L 27/11582* | (2017.01) | |
| *H01L 27/11565* | (2017.01) | |
| *H01L 27/11578* | (2017.01) | |
| *H01L 27/11519* | (2017.01) | |

(Continued)

(52) U.S. Cl.
CPC .. *H01L 27/11582* (2013.01); *H01L 27/11519* (2013.01); *H01L 27/11551* (2013.01); *H01L 27/11565* (2013.01); *H01L 27/11578* (2013.01); *H01L 27/11556* (2013.01)

(58) Field of Classification Search
CPC ........................................ H01L 27/115–11597
See application file for complete search history.

(56) References Cited

U.S. PATENT DOCUMENTS

2005/0233553 A1    10/2005  Kountz et al.
2010/0181610 A1*   7/2010  Kim ................. H01L 27/11582
                                                    257/314

(Continued)

FOREIGN PATENT DOCUMENTS

| CN | 103490008 A | 1/2014 |
| CN | 104701323 A | 6/2015 |

OTHER PUBLICATIONS

Office Action issued by China National Intellectual Property Administration dated Jan. 21, 2020.
Office Action for U.S. Appl. No. 16/684,245 dated May 26, 2022.

*Primary Examiner* — Brigitte A Paterson
(74) *Attorney, Agent, or Firm* — IP & T Group LLP

(57) ABSTRACT

The present disclosure may provide a semiconductor device having a stable structure and a low manufacturing degree of the difficulty. The device may include conductive layers and insulating layers which are alternately stacked; a plurality of pillars passing through the conductive layers and the insulating layers; and a plurality of deposition inhibiting patterns, each deposition inhibiting pattern being formed along a portion of an interface between a side-wall of each of the pillars and each of the conductive layers and along a portion of an interface between each of the insulating layers and each of the conductive layers.

9 Claims, 19 Drawing Sheets

(51) Int. Cl.
  *H01L 27/11551* (2017.01)
  *H01L 27/11556* (2017.01)

(56) References Cited

U.S. PATENT DOCUMENTS

| | | | |
|---|---|---|---|
| 2011/0287612 A1* | 11/2011 | Lee | H01L 27/11578 438/478 |
| 2014/0070300 A1* | 3/2014 | Jang | H01L 27/11565 257/324 |
| 2016/0172370 A1* | 6/2016 | Makala | H01L 29/517 438/269 |
| 2016/0225781 A1 | 8/2016 | Son et al. | |
| 2016/0225866 A1* | 8/2016 | Peri | H01L 29/40114 |
| 2016/0300848 A1* | 10/2016 | Pachamuthu | H01L 23/5226 |

* cited by examiner

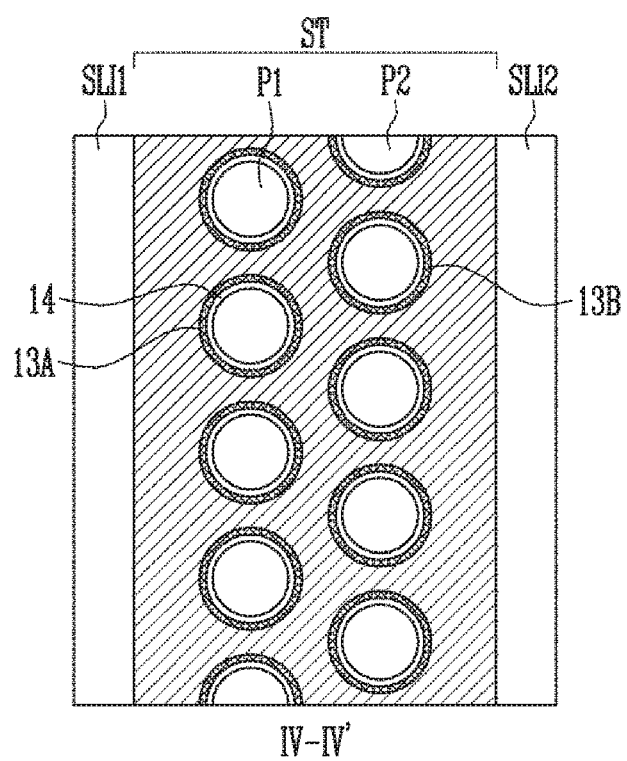

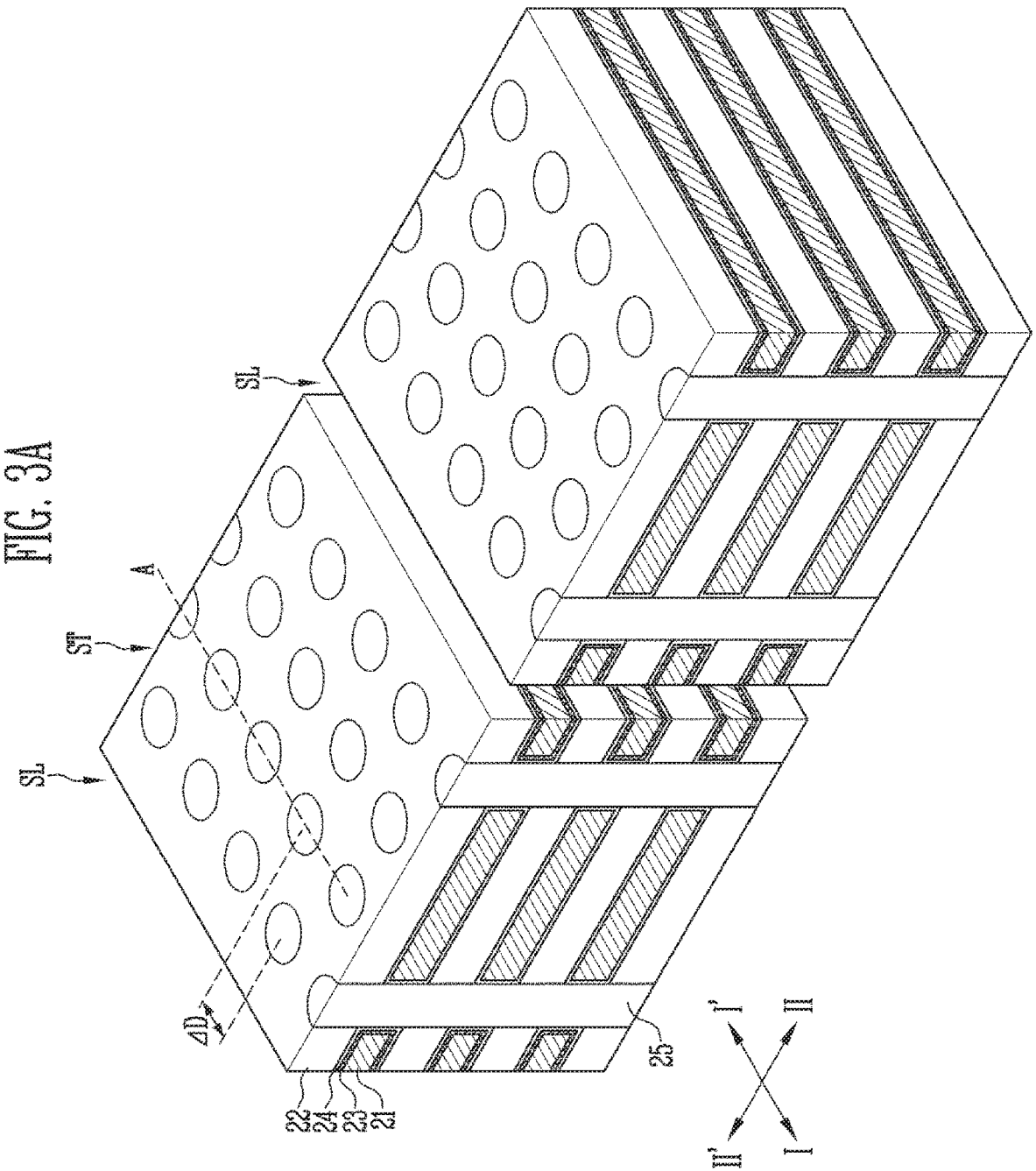

THREE-DIMENSIONAL SEMICONDUCTOR DEVICE HAVING DEPOSITION INHIBITING PATTERNS

CROSS-REFERENCE TO RELATED APPLICATION

This application is a division of U.S. patent application Ser. No. 15/687,131 filed on Aug. 25, 2017, which is a division of U.S. patent application Ser. No. 14/980,244 filed on Dec. 28, 2015 issued as U.S. Pat. No. 9,780,114 on Oct. 3, 2017, which claims priority to Korean patent application number 10-2015-0103965, filed on Jul. 22, 2015. The disclosure of each of the foregoing applications is herein incorporated by reference in its entirety.

BACKGROUND

1. Field

The present disclosure relates to a semiconductor device and a method of manufacturing the same and, in particular, to a 3-dimensional semiconductor device and a method of manufacturing the same.

2. Description of the Related Arts

A non-volatile memory device may maintain already-stored data in a power-off state. As a 2D memory device with a single layer memory cell on a silicon substrate has reached a maximum degree in an integration aspect, a 3-dimensional non-volatile memory device with a vertical memory cells stack which is formed on a silicon substrate has been suggested.

The 3-dimensional non-volatile memory device has vertical alternations of conductive layers and insulating layers in order to achieve a memory cells stack. For example, the sacrificial layers and insulating layers are alternated and, then, the sacrificial layers are replaced with the conductive layer. However, it is difficult to properly execute the replacement process, and damage may occur to neighboring layers due to reaction gases remaining in the conductive layer. This may lower a production yield, and performance of the memory device may deteriorate.

SUMMARY

An embodiment is directed to a semiconductor device with a stable structure and a low manufacturing degree of difficulty, and a method of manufacturing the same.

In one aspect of the present disclosure, there is provided a semiconductor device comprising: first and second slit insulating layers, each slit insulating layer extending in a first direction; a stacked structure including conductive layers and insulating layers, which are alternately stacked and disposed between the first and second slit insulating layers, wherein the stacked structure includes first, second, and third regions, wherein the first region contacts the first slit insulating layer, wherein the second region contacts the second slit insulating layer, wherein the third region is defined between the first region and the second region; a plurality of first pillars arranged in the first direction, each first pillar passing through the first region of the stacked structure; a plurality of second pillars arranged in the first direction, each second pillar passing through the second region of the stacked structure; and a plurality of first deposition inhibiting patterns, each first deposition inhibiting pattern being disposed between each of the conductive layers and each of the insulating layers in the first region, each first deposition inhibiting pattern surrounding at least a portion of a side-wall of each of the first pillars.

In one aspect of the present disclosure, there is provided a semiconductor device comprising: conductive layers and insulating layers which are alternately stacked; a plurality of pillars passing through the conductive layers and the insulating layers; and a plurality of deposition inhibiting patterns, each deposition inhibiting pattern being formed along a portion of an interface between a side-wall of each of the pillars and each of the conductive layers and along a portion of an interface between each of the insulating layers and each of the conductive layers.

In one aspect of the present disclosure, there is provided a method of manufacturing a semiconductor device, comprising: alternately forming sacrificial layers and insulating layers; forming a plurality of pillars, each pillar passing through the sacrificial layers and the insulating layers; forming a slit, the slit passing through the sacrificial layers and the insulating layers, the slit extending in a first direction; forming openings by removing the sacrificial layers through the slit; forming an deposition inhibiting layer, the deposition inhibiting layer surrounding at least partially a side-wall of each of the pillars and each of the insulating layers, the side-wall being exposed through each of the openings; and forming conductive layers respectively in the openings.

In accordance with the present disclosure, the gate electrode may be formed using the deposition inhibiting pattern surrounding at least a portion of the side-wall of the pillar. In this way, the gate electrode may have a high compactness due to containing no voids therein. This may lead to the semiconductor device having a stable structure and a low manufacturing degree of the difficulty.

BRIEF DESCRIPTION OF THE DRAWINGS

A brief description of each drawing is provided to more fully understand the drawings, which is incorporated in the detailed description of the disclosure.

FIG. 1B is a cross-sectional view of FIG. 1A; FIG. 1C is a plan view taken along the line III-III' of FIG. 1B; and FIG. 1D is a plan view taken along the line IV-IV' of FIG. 1B.

FIG. 2C is a plan view taken along the line IV-IV' of FIG. 2A.

FIG. 3A is a perspective view of a semiconductor device in accordance with one implementation of the present disclosure.

FIG. 3B is a cross-sectional view of FIG. 3A; FIG. 3C is a plan view taken along the line III-III' of FIG. 3B; and FIG. 3D is a plan view taken along the line IV-IV' of FIG. 3B.

FIG. 5A to FIG. 10A and FIG. 5B to FIG. 10B illustrate a method of manufacturing a semiconductor device in accordance with one implementation of the present disclosure. Each of FIG. 5A to FIG. 10A illustrates a cross-sectional view. Each of FIG. 5B to FIG. 10B illustrates a plan view.

DETAILED DESCRIPTION

Figure 1A:
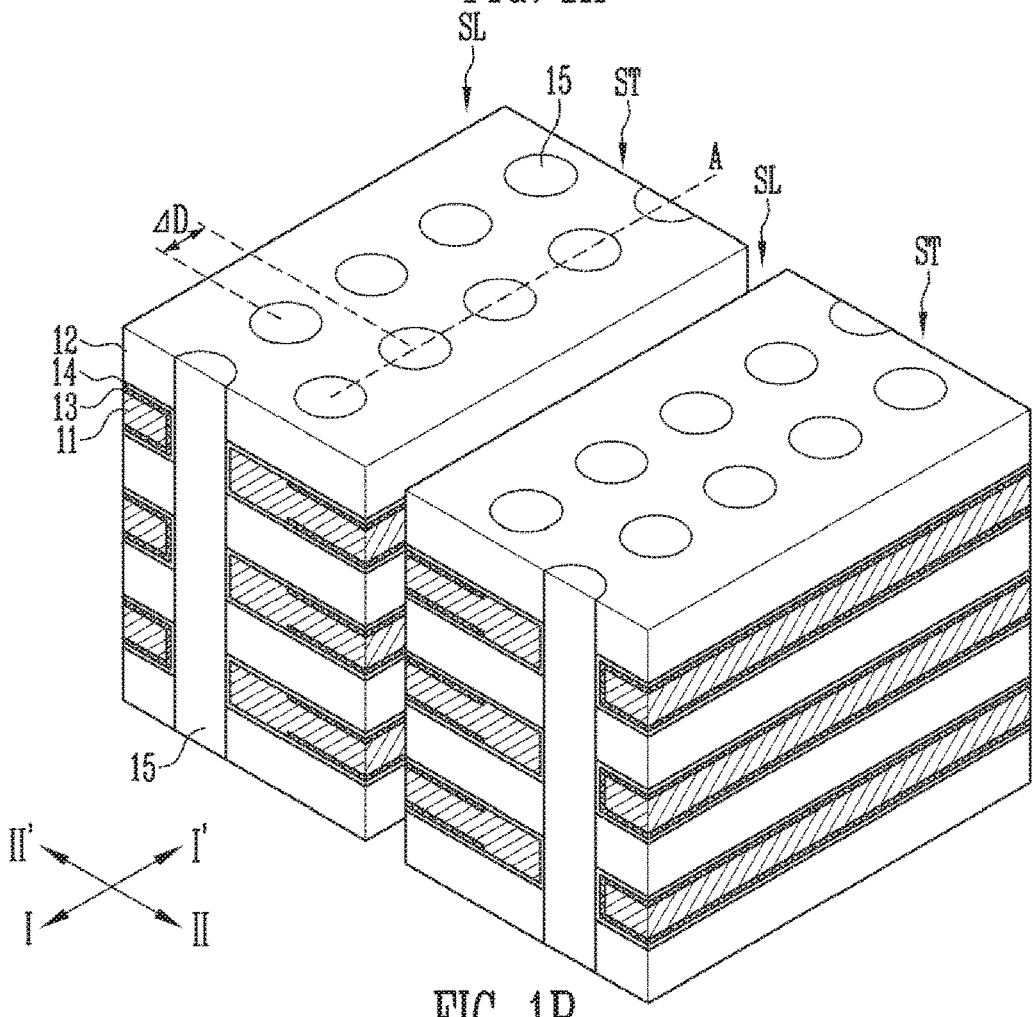
FIG. 1A is a perspective view of a semiconductor device in accordance with one implementation of the present disclosure.

Examples of various embodiments are illustrated in the accompanying drawings and are described further below. It will be understood that the discussion herein is not intended to limit the claims to the specific embodiments described. On the contrary, it is intended to cover alternatives, modifications, and equivalents as may be included within the spirit and scope of the present disclosure as defined by the appended claims.

Example embodiments will be described in more detail with reference to the accompanying drawings. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "connected to", or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or groups thereof. As used herein, the term "and/or" includes any and all combinations of one or more of the associated listed items. Expression such as "at least one of" when preceding a list of elements may modify the entire list of elements and may not modify the individual elements of the list.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description, numerous specific details are set forth in order to provide a thorough understanding of the present disclosure. The present disclosure may be practiced without some or all of these specific details. In other instances, well-known process structures and/or processes have not been described in detail in order not to unnecessarily obscure the present disclosure.

Hereinafter, the various embodiments of the present disclosure will be described in details with reference to attached drawings.

FIG. 1A is a perspective view of a semiconductor device accordance with one implementation of the present disclosure. In this implementation, a single stacked structure ST may include two pillar rows.

Referring to FIG. 1A, a semiconductor device in accordance with one implementation of the present disclosure may include a stacked structure ST including conductive layers 11 and insulating layers 12, which are alternately stacked, the pillars 15 passing through the stacked structure ST, and deposition inhibiting patterns 13 contacting the conductive layers 11.

The pillars 15 may be arranged in a first direction I-I' and a second direction II-II' which is crossing the first direction I-I'. A plurality of pillars 15 are included in a single pillar row. In an embodiment, centers of the plurality of pillars 15 are arranged in the first direction I-I'.

In another embodiment, the pillars 15 may have a staggered arrangement. That is, centers of adjacent pillars 15 may be arranged in a staggered manner in one direction. In yet another example, the pillars 15 may be arranged in a linear manner in the first direction I-I' (See "A" line), while the pillars 15 may be arranged in a staggered manner in the second direction II-II'. In the staggered structure, centers of two neighboring pillars 15 are arranged by a spacing ΔD. In this way, via the arrangement of the pillars 15 in the staggered manner, the pillars may have a higher compactness.

The pillars 15 may include a semiconductor material. In one example, the material may include silicon (Si), germanium (Ge), etc. The pillars 15 may serve as a channel layer for a memory cell, selection transistor, etc. Although not shown in the figure, each of the pillars 15 may contain an open central region which may be filled with a gap-fill insulating layer.

When the pillars 15 may serve as a channel layer for a memory cell, a memory layer may be disposed between each of the pillars 15 and each of the conductive layers 11. In one example, the memory layer may include a tunnel-insulating layer, a data storage layer, and/or a charge-blocking layer. The data storage layer may include silicon, a nitride, nano-dots, phase-transform materials or the like. When each of the pillars 15 may serve as a channel layer for a selection transistor, a gate insulating layer may disposed between each of the pillars 15 and each of the conductive layers 11. In one example, the gate insulating layer may include oxide, nitride, or the like. The memory layer and the gate insulating layer may be formed of the same material.

The conductive layers 11 may include a metal. In one example, the metal may include tungsten W, tungsten nitride $WN_x$ or the like. The conductive layers 11 may serve as a gate electrode for a memory cell, a selection transistor, etc. The insulating layers 12 may include oxide, nitride or the like. The insulating layer 12 may be disposed between the gate electrodes and insulating the gate electrodes from each other.

The deposition inhibiting patterns 13 may, in the course of replacing the sacrificial layers (not shown) with the conductive layers 11, serve to control a conductive material forming location. The deposition inhibiting patterns 13 may include a non-conductive material, such as nitrogen atoms N, oxygen atoms O or the like. In one example, the deposition inhibiting patterns 13 may be made of a nitride layer or an oxide layer.

Moreover, each of the deposition inhibiting patterns 13 may surround at least a portion of a side-wall of each of the pillars 15, and may be disposed between each of the conductive layers 11 and each of the insulating layers 12. In one example, each of the deposition inhibiting patterns 13 may have a cross-section in a "C" shape so as to surround a side-wall of each of the pillars 15 and a surface of each of the conductive layers 11. That is, each of the deposition inhibiting patterns 13 extends from between each of the conductive layers 11 and each of the insulating layers 12 to between each of the conductive layers 11 and the side-wall of each of the pillars 15.

The semiconductor device may include a plurality of the stacked structures ST. In this case, between the stacked structures ST, slits SL are disposed which are extending in the first direction I-I'. Although not shown in the figure, each of the slits SL may be filled with a slit insulating layer. The slit insulating layer may fill completely the slit SL or incompletely fill the slit SL so as to form an air gap therein.

The semiconductor device may further include barrier patterns 14 which are respectively disposed between the conductive layers 11 and the insulating layers 12 and extend between the conductive layers 11 and the pillars 15. In one example, the barrier patterns 14 may be disposed respectively between the deposition inhibiting patterns 13 and the insulating layers 12. Further, the barrier pattern 14 may include tantalum Ta, titanium Ti, tantalum nitride TaN, titanium nitride TiN, or the like.

Figure 1B:
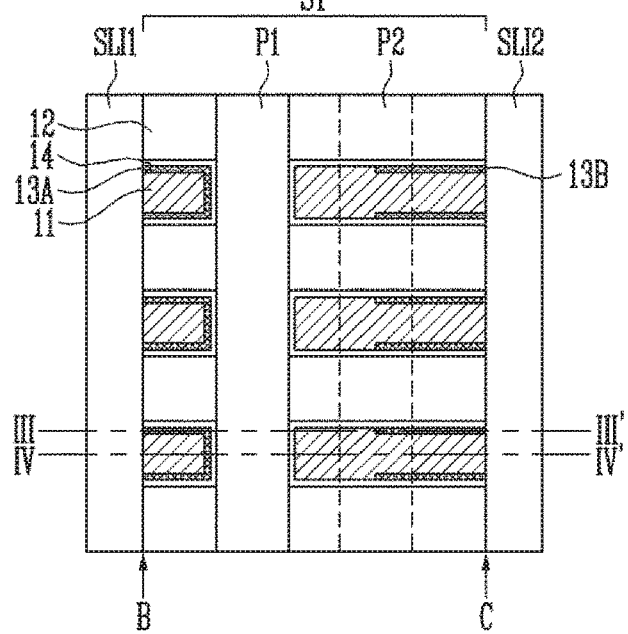
FIG. 1B to FIG. 1D illustrate details of the structure of FIG. 1A.
Figure 1C:
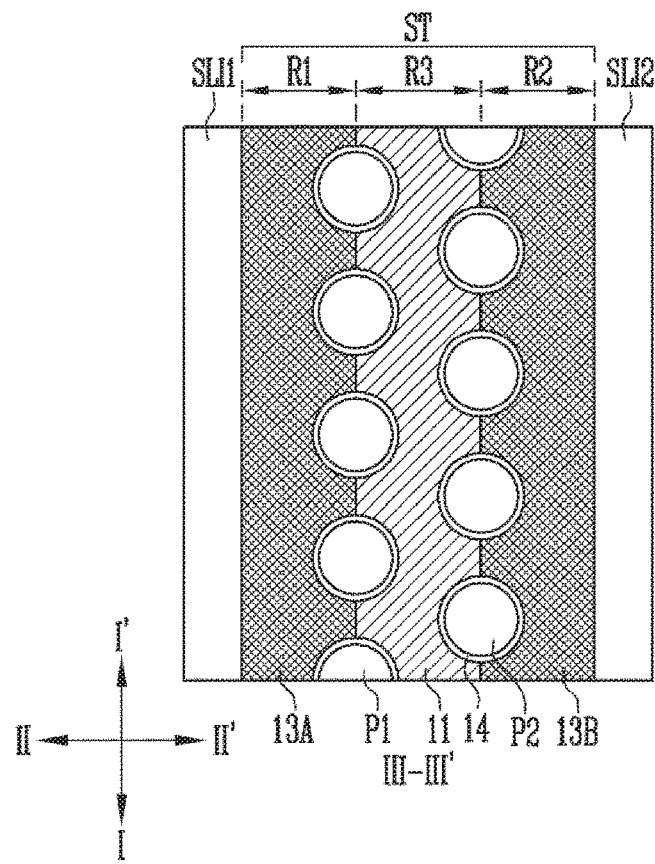
Figure 1D:
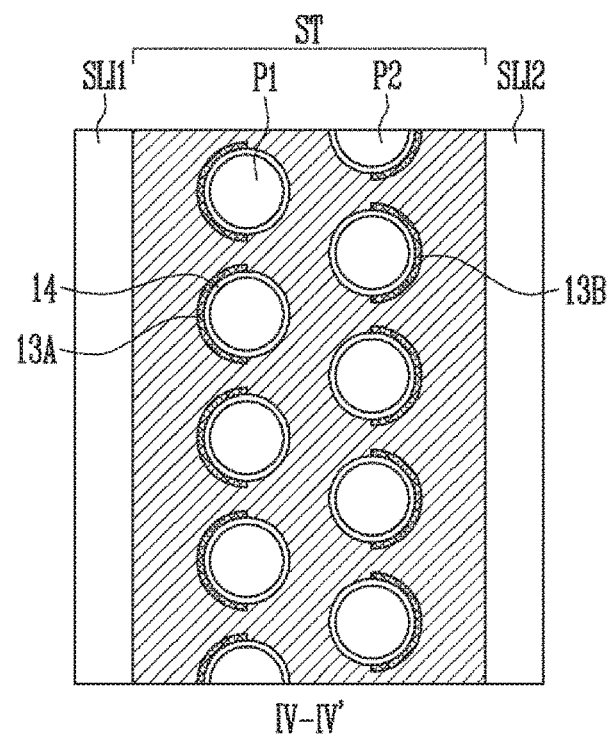

FIG. 1B to FIG. 1D illustrate details of the structure of FIG. 1A. FIG. 1B is a cross-sectional view of the semiconductor device in accordance with one implementation of the present disclosure; FIG. 1C is a plan view taken along the line III-III' of FIG. 1B; and FIG. 1D is a plan view taken along the line IV-IV' of FIG. 1B.

Referring to FIG. 1B, the semiconductor device may include first and second slit insulating layers SLI1, SLI2, each slit extending in the first direction I-I'. Between the first slit insulating layer SLI1 and second slit insulating layer SLI2, the stacked structure ST is disposed. Therefore, the stacked structure ST may have one side-wall B contacting the first slit insulating layer SLI1 and the other side-wall C contacting the second slit insulating layer SLI2.

Referring to FIG. 1C, the stacked structure ST may include a first region R1 contacting the first slit insulating layer SLI1, a second region R2 contacting the second slit insulating layer SLI2, and a third region R3 between the first region R1 and second region R2. The first to third regions R1 to R3 may have the same or different width.

The first pillars P1 may pass through the first region R1 of the stacked structure ST and be arranged in the first direction I-I'. The second pillars P2 may pass through the second region R2 of the stacked structure ST and may be arranged in the first direction I-I'. A first row of the first pillars P1 and a second row of the second pillars P2 may be adjacent to each other in the second direction II-II'. The first pillars P1 may have respective centers offset from the second pillars P2. Further, the pillars P1 may be located at a boundary between the first region R1 and third region R3, while the second pillars P2 may be located at a boundary between the second region R2 and third region R3.

The first deposition inhibiting patterns 13A may be disposed respectively between the conductive layers 11 and insulating layers 12 in the first region R1. The second deposition inhibiting patterns 13B may be disposed respectively between the conductive layers 11 and insulating layers 12 in the second region R2.

Referring to FIG. 1D, each of the first deposition inhibiting patterns 13A may surround a portion of the side-wall of each of the first pillars P1, respectively. The portion of the side-wall may refer to a portion of the side-wall facing the first slit insulating layer SLI1. That is, each of the first deposition inhibiting patterns 13A may not be formed along a portion of the side-wall of each of the first pillars P1 facing the second pillars P2.

Each of the second deposition inhibiting patterns 13B may surround a portion of a side-wall of each of the second pillars P2. The portion of the side-wall surrounded by the second deposition inhibiting pattern 13B may refer to a portion of the side-wall facing the second slit insulating layer SLI2. That is, each of the second deposition inhibiting patterns 13B may not be formed along a portion of the side-wall of each of the second pillars P2 facing the first pillars P1.

Referring to FIG. 1B to FIG. 1D, each of the barrier patterns 14 may be disposed between each of first and second pillars P1, and P2 and each of the conductive layers 11, and between each of the conductive layers 11 and each of the insulating layers 12. Further, each of the first and second deposition inhibiting patterns 13A and 13B may be disposed partially along an interface between each of the conductive layers 11 and each of the barrier patterns 14. In one example, the first and second deposition inhibiting patterns 13A and 13B are disposed in the first and second regions R1 and R2, respectively. Each of the first deposition inhibiting patterns 13A is disposed between each of the conductive layers 11 and each of the barrier patterns 14. Each of the second deposition inhibiting patterns 13B is disposed between each of the conductive layers 11 and each of the barrier patterns 14.

In the third region R3, there may not be disposed each of the first and second deposition inhibiting patterns 13A and 13B. That is, in the third region R3, each of the conductive layers 11 and each of the barrier patterns 14 maybe in direct contact with each other.

In the above-addressed configuration, each of the first and second deposition inhibiting patterns 13A, 13B may surround each of portions of the side-walls of the first and second pillars P1, P2, resulting in a compactness of the conductive layers 11 without any voids.

Figure 2A:
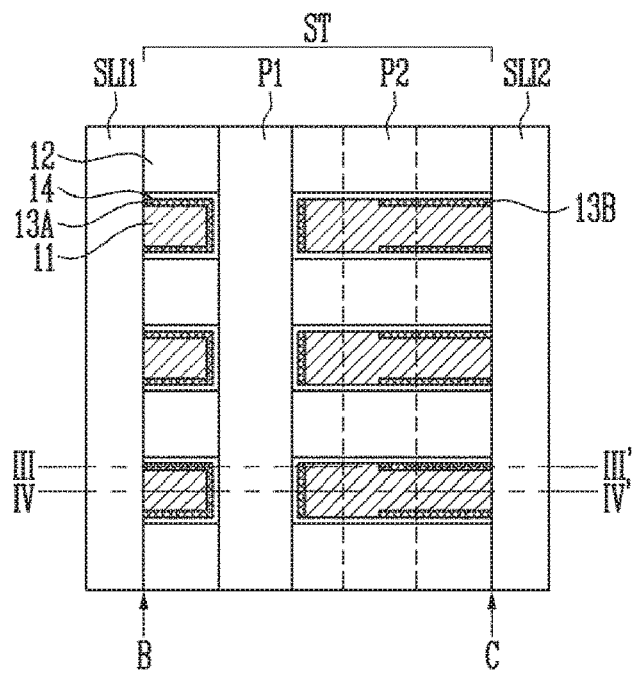
FIG. 2A is a cross-sectional view of the semiconductor device in accordance with one implementation of the present disclosure.
Figure 2B:
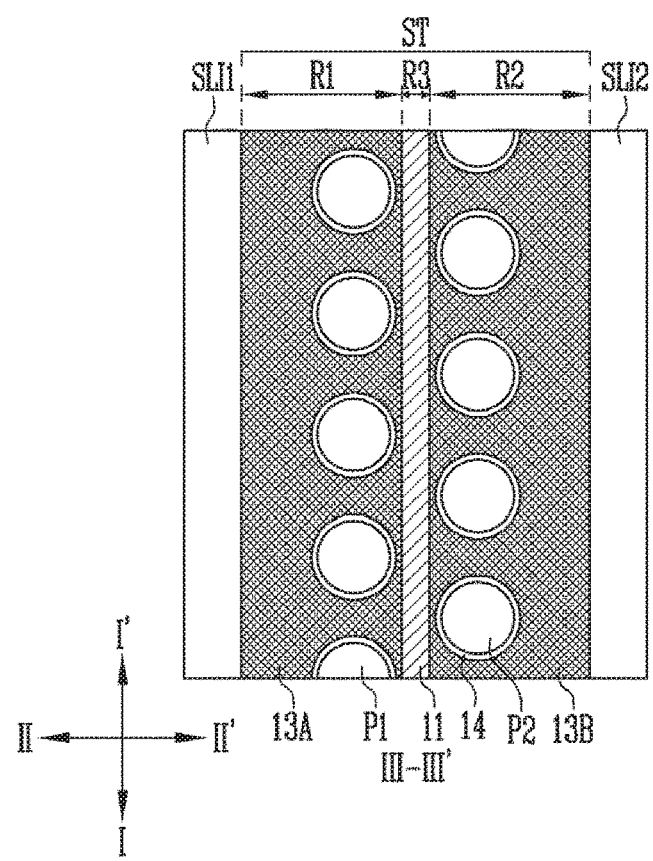
FIG. 2B is a plan view taken along the line III-III' of FIG. 2A.

FIG. 2A is a cross-sectional view of the semiconductor device in accordance with one implementation of the present disclosure. FIG. 2B is a plan view taken along the line III-III' of FIG. 2A; FIG. 2C is a plan view taken along the line IV-IV' of FIG. 2A. Hereinafter, descriptions of the same or similar elements as described above may be omitted.

Referring to FIG. 2A to FIG. 2C, first pillars P1 may be disposed in a stacked structure ST in the first region R1, and second pillars P2 may be disposed in the stacked structure ST in the second region R2. Therefore, each of first deposition inhibiting patterns 13A may surround an entirety of a side-wall of each of the first pillars P1, and each of second deposition inhibiting patterns 13B may surround an entirety of a side-wall of each of the second pillars P2. Further, each of the first and second deposition inhibiting patterns 13A and 13B may be disposed between each of the conductive layers 11 and each of barrier patterns 14.

FIG. 3A is a perspective view of a semiconductor device accordance with one implementation of the present disclosure. In this implementation, a single stacked structure ST may include four pillar rows.

Referring to FIG. 3A, a semiconductor device in accordance with one implementation of the present disclosure may include a stacked structure ST, pillars 25, and deposition inhibiting patterns 23. In each of stacked structure ST, conductive layers 21 and insulating layers 22 are vertically and alternately stacked. Pillars 25 pass through the stacked structure ST and the deposition inhibiting patterns 23 contact the conductive layers 21.

The pillars 25 may be arranged in a first direction I-I' and a second direction II-II' crossing the first direction I-I'. Centers of the pillars 25 in a single pillar row are aligned in the first direction I-I'. The pillars 25 may have a staggered arrangement in the second direction II-II' so that centers of adjacent pillars 25 are arranged in a staggered manner. In one example, the pillars 25 may be arranged in a linear manner in the first direction I-I' while the pillars 25 may be arranged in a staggered manner in the second direction II-II'. In the staggered manner, the pillars 25 may have respective centers offset from each other by a spacing ΔD. In this way, the pillars may have a higher integration.

Barrier patterns 24 may be disposed respectively between the pillars 25 and the conductive layers 21 and between the conductive layers 21 and the insulating layers 22. Further, each of the deposition inhibiting patterns 23 may surround at least a portion of a side-wall of each of the pillars 25 and be disposed partially between each of the conductive layers 21 and each of the barrier patterns 24. In one example, each of the barrier patterns 24 may be disposed between each of the deposition inhibiting patterns 23 and each of the insulating layers 22.

Figure 3B:
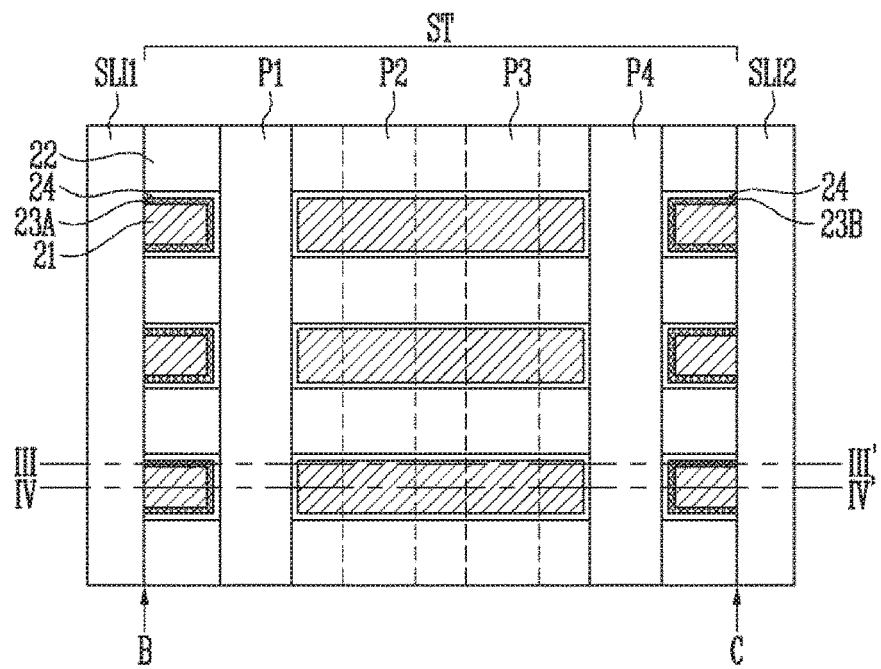
FIG. 3B to FIG. 3D illustrate details of the structure of FIG. 3A.
Figure 3C:
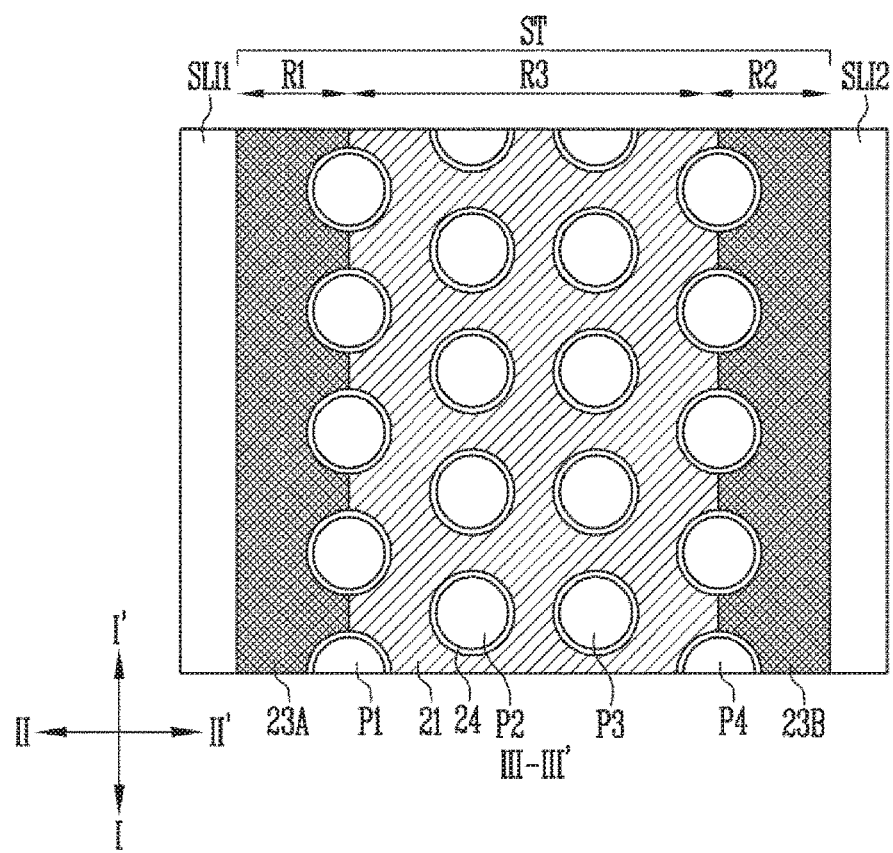
Figure 3D:
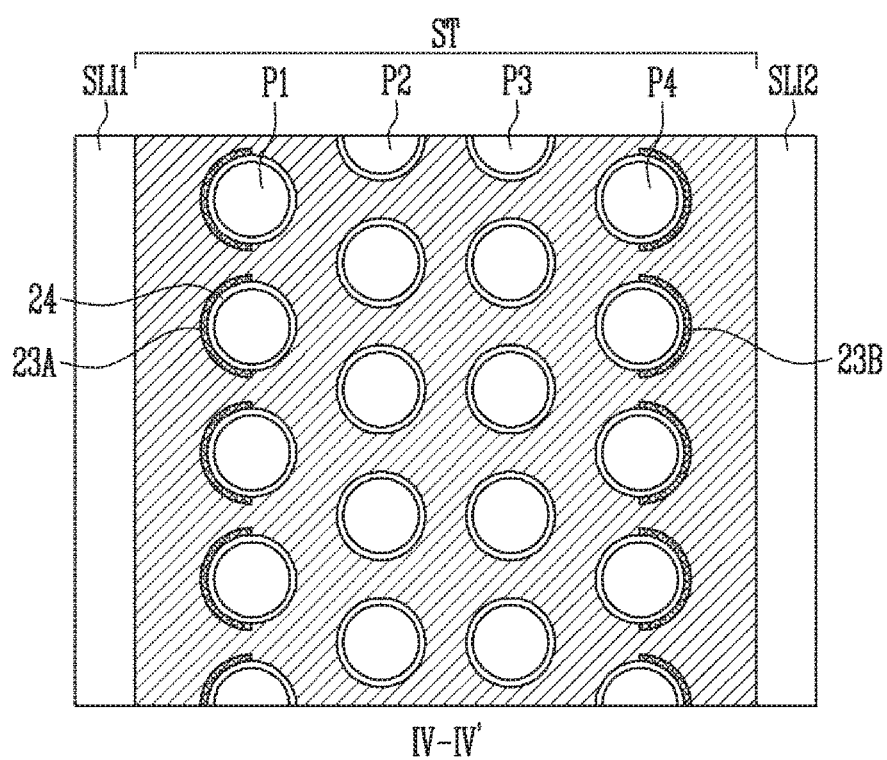

FIG. 3B to FIG. 3D illustrate details of the structure of FIG. 3A. FIG. 3B is a cross-sectional view of the semiconductor device in accordance with one implementation of the present disclosure; FIG. 3C is a plan view taken along the line III-III' of FIG. 3B; and FIG. 3D is a plan view taken along the line IV-IV' of FIG. 3B.

Referring to FIG. 3B, the semiconductor device may include first and second slit insulating layers SLI1, and SLI2, each slit layer extending in the first direction I-I'. The stacked structure ST may be disposed between the first slit insulating layer SLI1 and second slit insulating layer SLI2.

In this way, the stacked structure ST may have one side-wall contacting the first slit insulating layer SLI1 and the other side-wall contacting the second slit insulating layer SLI2.

Referring to FIG. 3C, first to fourth pillars P1 to P4 may be arranged from one side-wall to the other side-wall of the stacked structure ST. The first pillars P1 arranged in the first direction I-I' may form a first pillar row; the second pillars P2 arranged in the first direction I-I' may form a second pillar row; the third pillars P3 arranged in the first direction I-I' may form a third pillar row; and the fourth pillars P4 arranged in the first direction I-I' may form a fourth pillar row. Further, the first pillars P1 and second pillars P2 adjacent to each other in the second direction II-II' may have a staggered arrangement. Likewise, the third pillars P3 and fourth pillars P4 adjacent to each other in the second direction II-II' may have a staggered arrangement. The second pillars P2 and third pillars P3 adjacent to each other in the second direction II-II' may have a staggered or linear arrangement.

The stacked structure ST may include a first region R1 contacting the first slit insulating layer SLI1, a second region R2 contacting the second slit insulating layer SLI2, and a third region R3 between the first region R1 and second region R2. In this connection, the first pillars P1 may pass through the first region R1; the fourth pillars P4 may pass through the second region R2; and the second and third the pillars may run through the third region R3 of the stacked structure ST. Further, the first pillars P1 may be located at boundary between the first region R1 and third region R3; the fourth the pillars P4 may be located at a boundary between the second region R2 and third region R3; and the second and third pillars P2, P3 may be disposed in the third region R3.

The first deposition inhibiting patterns 23A may be disposed respectively between the conductive layers 21 and insulating layers 22 in the first region R1. The second deposition inhibiting patterns 233 may be disposed respectively between the conductive layers 21 and insulating layers 22 in the second region R2.

Referring to FIG. 3D, each of the first deposition inhibiting patterns 23A may surround a portion of a side-wall of each of the first pillars P1. In this connection, the portion of the side-wall may refer to a side-wall portion facing the first slit insulating layer SLI1. That is, each of the first deposition inhibiting patterns 23A may not be formed along a portion of the side-wall of each of the first pillars P1 facing the second pillars P2 adjacent thereto in the second direction II-II'.

Each of the second deposition inhibiting patterns 23B may surround a portion of a side-wall of each of the fourth pillars P4. In this connection, the portion of the side-wall may refer to a side-wall portion facing the second slit insulating layer SLI2. That is, each of the second deposition inhibiting patterns 23b may not be formed along a portion of the side-wall of each of the fourth pillars P4 facing the third pillars P3.

Further, each of the first and second deposition inhibiting patterns 23A and 23B may not be formed along each of the side-walls of the second and third the pillars P2, and P3.

Figure 4A:
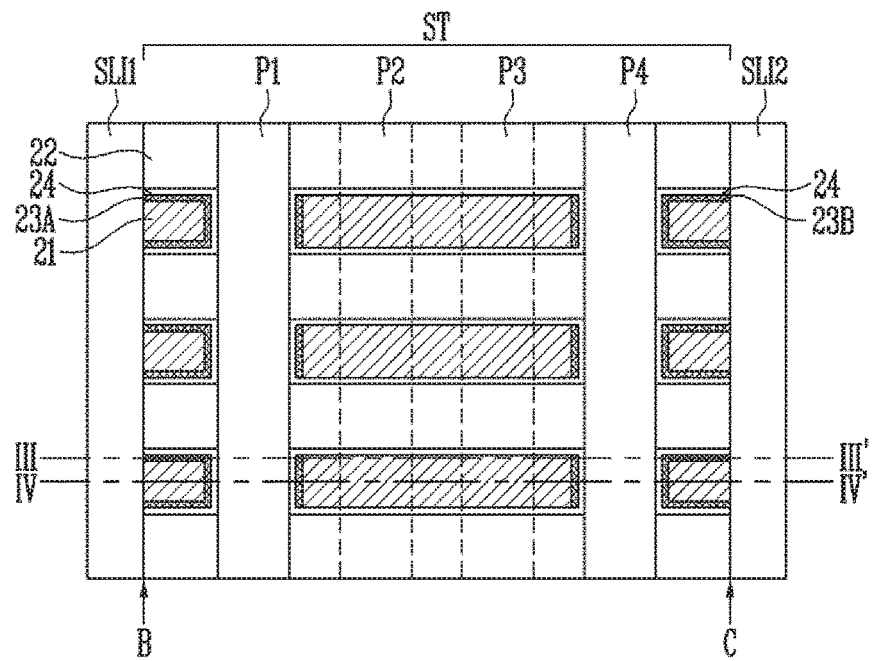
FIG. 4A is a cross-sectional view of the semiconductor device in accordance with one implementation of the present disclosure.
Figure 4B:
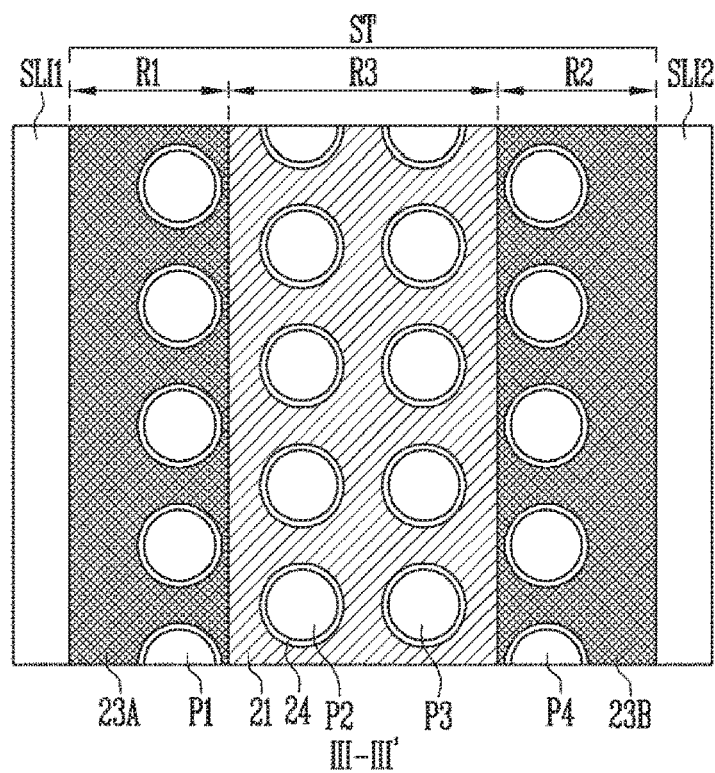
FIG. 4B is a plan view taken along the line III-III' of FIG. 4A.
Figure 4C:
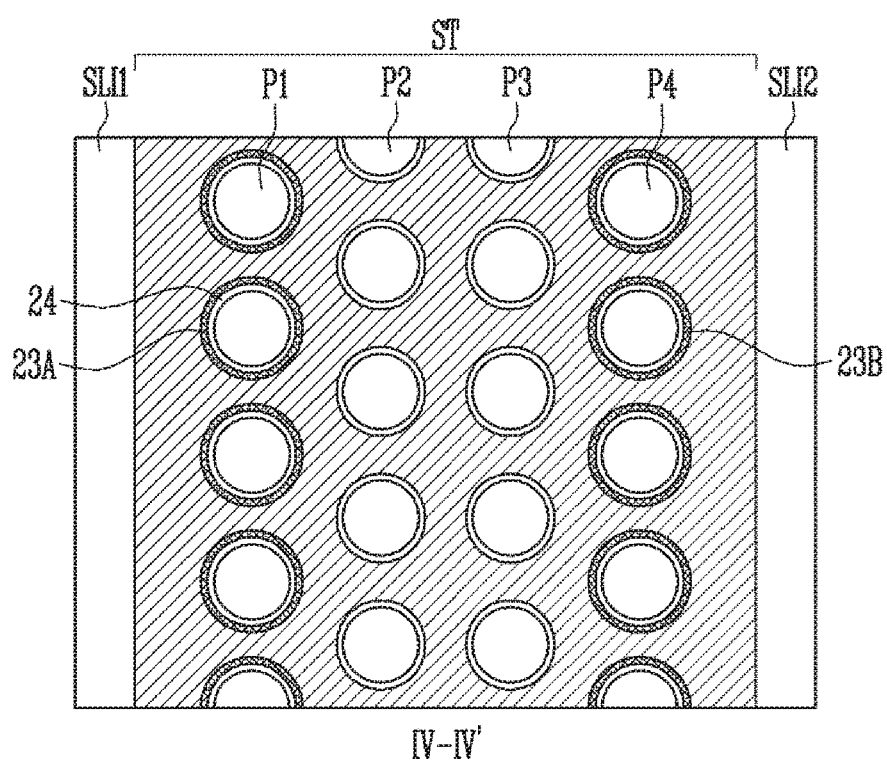
FIG. 4C is a plan view taken along the line IV-IV' of FIG. 4A.

FIG. 4A is a cross-sectional view of the semiconductor device in accordance with one implementation of the present disclosure. FIG. 4B is a plan view taken along the line III-III' of FIG. 4A; FIG. 4C is a plan view taken along the line IV-IV' of FIG. 4A. Hereinafter, descriptions of the same or similar elements as in the previous descriptions may be omitted.

Referring to FIG. 4A to FIG. 4C, the first pillars P1 may be disposed in a stacked structure ST in the first region R1; the fourth pillars P4 may be disposed in the stacked structure ST in the second region R2; and the second and third pillars P2 and P3 may be disposed in the stacked structure ST in the third region R3. Each of first deposition inhibiting patterns 23A may surround an entirety of a side-wall of each of the first pillars P1. Each of second deposition inhibiting patterns 23B may surround an entirety of a side-wall of each of the fourth pillars P4. Further, each of the first and second deposition inhibiting patterns 23A and 23B may be disposed between each of the conductive layers 21 and each of barrier patterns 24.

FIG. 5A to FIG. 10A and FIG. 5B to FIG. 10 illustrate a method of manufacturing the semiconductor device in accordance with one implementation of the present disclosure. Each of FIGS. 5A-10A indicates a cross-sectional view, and each of FIGS. 5B-10B indicates a plan view.

Figure 5A:
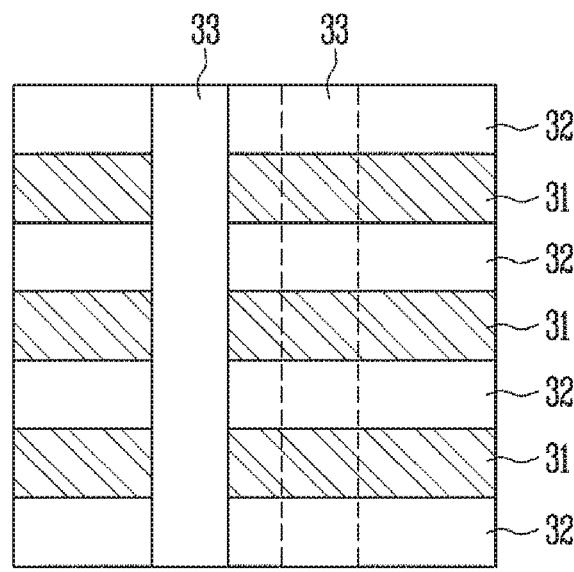
Figure 5B:
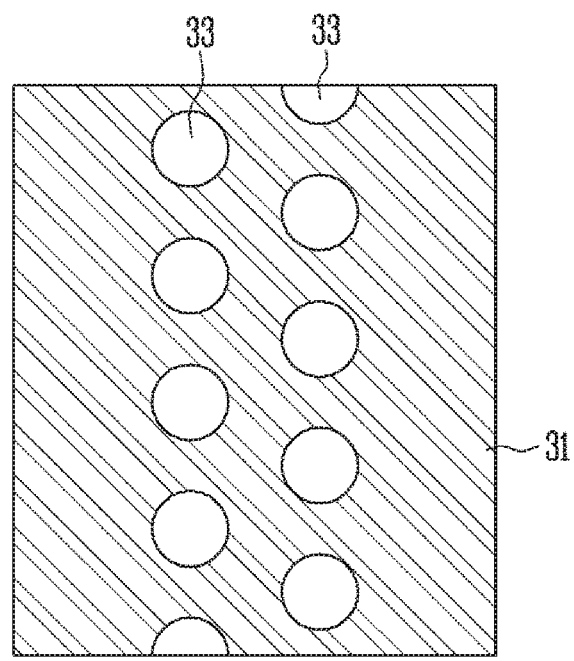

Referring to FIG. 5A and FIG. 5B, sacrificial layers 31 and insulating layers 32 may be alternately disposed. In this connection, the sacrificial layers 31 may have a higher etching selection rate than the insulating layers 32. In one example, the sacrificial layers 31 may include nitride or the like, while the insulating layers 32 may include oxide or the like.

Subsequently, pillars 33 may extend through the sacrificial layers 31 and insulating layers 32. In one example, after forming through-holes passing through the sacrificial layers 31 and insulating layers 32, the through-holes may be filled with the pillars 33. In this connection, the pillars 33 may be embodied as semiconductor patterns 33B. In this case, prior to the formation of the semiconductor patterns 33B, along and on the inner surface of the through-holes, a memory layer 33A may be formed. The memory layer 33A may include a charge blocking layer, a data storage layer and/or a tunnel insulating layer. The data storage layer may be made of silicon, nitride, nano-dots, phase-transformation material or the like.

Figure 6A:
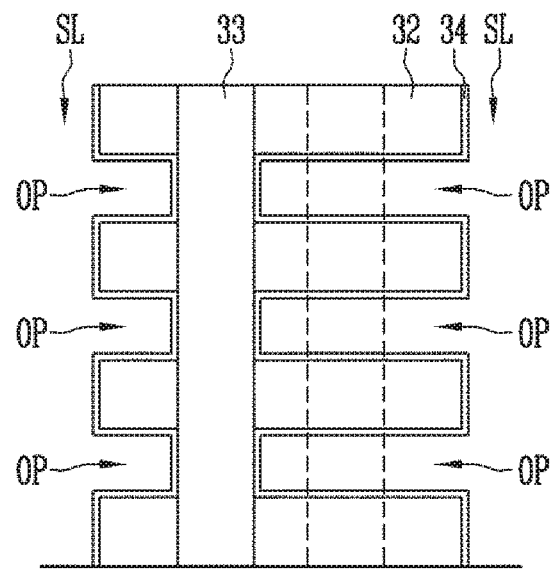
Figure 6B:
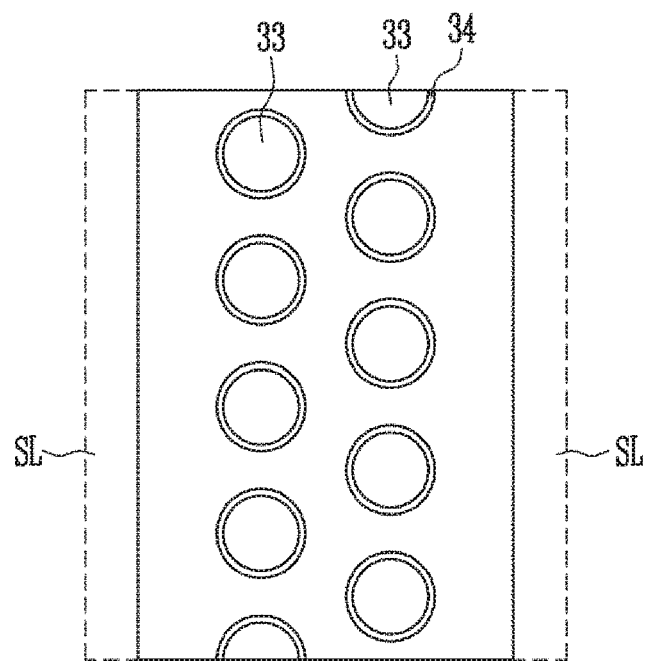

Referring to FIG. 6A and FIG. 6B, slits SL may be formed to pass through the sacrificial layers 31 and insulating layers 32. In this connection, the slits SL may be disposed between the pillars 33 and may have a line shape extension in one direction.

In this connection, the sacrificial layers 31 may be removed through the slits SL to form openings OP. Through the openings OP, the pillars 33 or memory layer may be exposed. In one example, when the sacrificial layers 31 include nitride, the sacrificial layers 31 may be selectively removed using a phosphoric-acid dip out process.

Next, a barrier layer 34 may be formed along and on exposed surfaces of the insulating layers 32 through the openings OP. The barrier layer 34 may be further formed along and on exposed side-walls or memory layers, of the pillars 33 through the openings OP. The barrier layer 34 may have a thickness so as to incompletely fill the opening OP. The barrier layer 34 may include tantalum Ta, titanium Ti, tantalum nitride TaN, titanium nitride TiN, or the like. Prior to the formation of the barrier layer 34, a memory layer may be formed in the openings OP. The memory layer may include a charge blocking layer, a data storage layer, and/or a tunnel insulating layer. The data storage layer may include silicon, nitride, nano-dots, phase-transformation material, or the like.

Figure 7A:
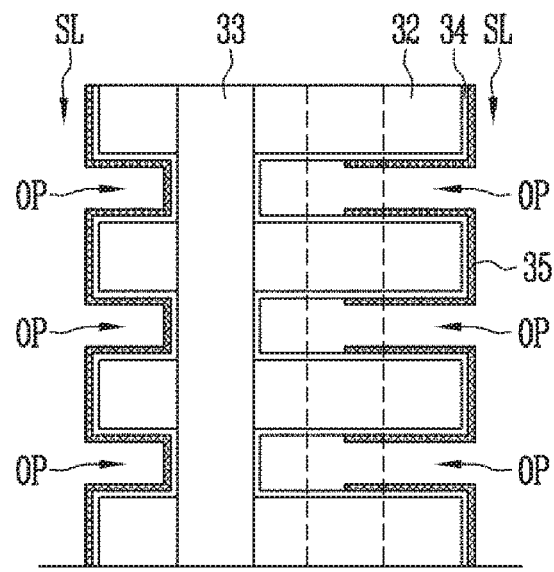
Figure 7B:
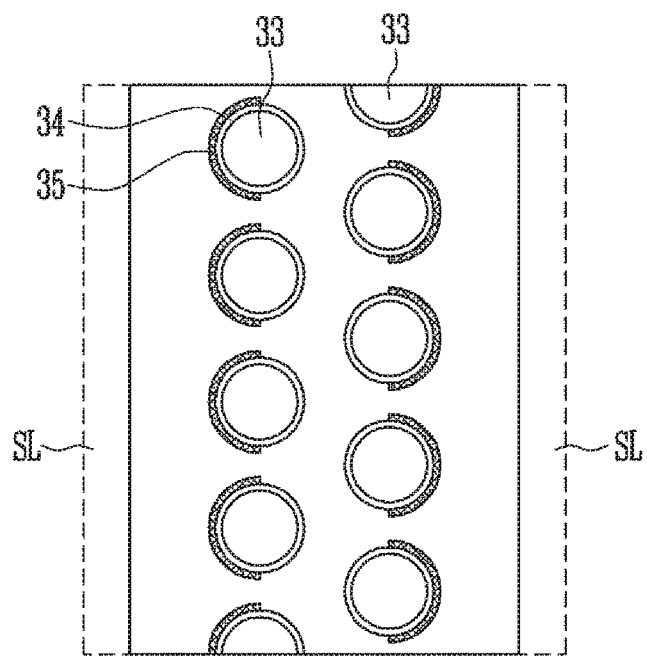

Referring to FIG. 7A and FIG. 7B, a deposition inhibiting layer 35 may be formed on an exposed surface of the barrier layer 34 through the openings OP. In this connection, the deposition inhibiting layer 35 may be formed on a portion of the exposed surface of the barrier layer 34 through the openings OP using a poor step-coverage approach. In one example, the deposition inhibiting layer 35 may be formed on a only a portion of the exposed surface of the barrier layer 34 which is adjacent to the slit SL.

In this embodiment where the pillars 33 may have a staggered arrangement, the pillars 33 may be closer to one slit SL than the other slit SL Both slits SLs are disposed respectively at both sides of the stack. Thus, when a single stack includes three or more pillar rows, the deposition inhibiting layer 35 may be formed on the side-wall of each of outer pillars 33 which are relatively closer to the slit SL, while the deposition inhibiting layer 35 may not be formed on the side-wall of each of inner pillars 33 which are relatively more distant from the slit SL.

In one example, regions in which the deposition inhibiting layer 35 is formed may be controlled by adjusting a gas flow rate, temperature, pressure, processing time, or the like during the process of forming the deposition inhibiting layer 35. The deposition inhibiting layer 35 may be formed on only side-walls of pillars 33 which are adjacent to the slit SL. Alternatively, the deposition inhibiting layer 35 may be formed to surround entire surfaces of the side-walls of the pillar 33 which are next to the slit SL, or only portions of the surfaces of the side-walls of the pillars 33 which face the slit SL.

The deposition inhibiting layer 35 may be formed using a N2 plasma process, an O2 plasma process, or the like, and may include nitride, oxide, or the like. In one example, in case of using the N2 plasma process, a nitride layer may be formed on the barrier layer 34. In case of using the O2 plasma process, an oxide layer may be formed on the barrier layer 34. The deposition inhibiting layer 35 formation process may be executed at a temperature ranging from room temperature to 500° C. Moreover, the deposition inhibiting layer 35 may have a thickness that incompletely fills the openings OP. In one example, the thickness may include 1 to 100 Å.

Figure 8A:
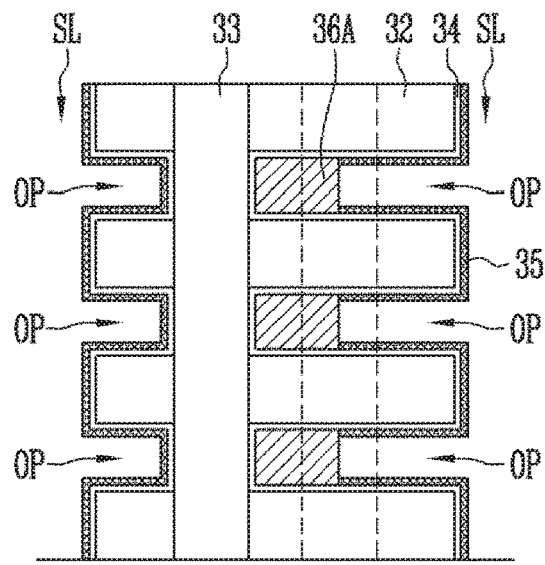
Figure 8B:
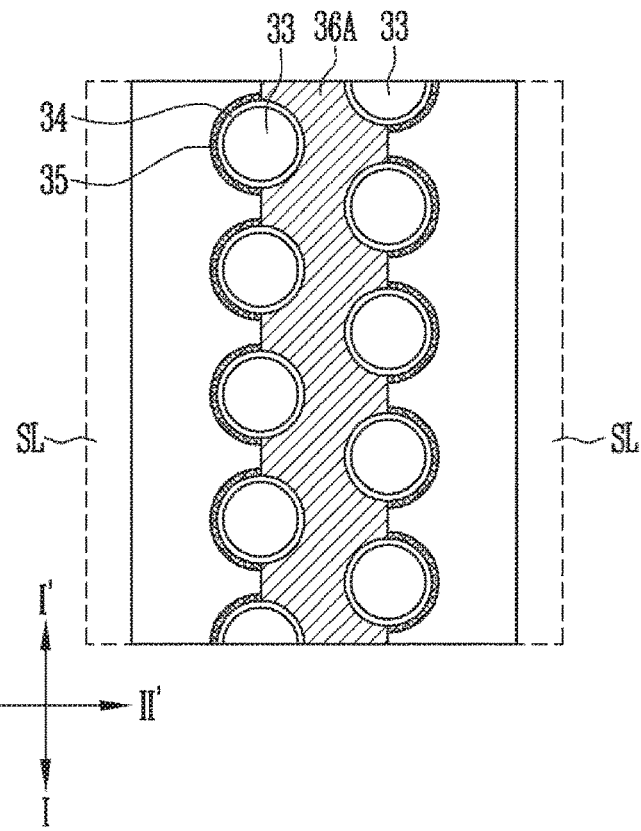

Referring to FIG. 8A and FIG. 8B, conductive layers 36A may be deposited on the barrier layer 34 region which is not covered by the deposition inhibiting layer 35. The surface of the barrier layer 34 may serve as a nucleation site, while the surface of the deposition inhibiting layer 35 may not serve as a nucleation site. Therefore, the surface of the deposition inhibiting layer 35 may have a less adhesive force than the surface of the barrier layer 34. In this connection, the conductive layers 36A may not be deposited on the deposition inhibiting layer 35 but may be deposited on the barrier layer 34. This may result in a selective deposition. Between the pillars 33 facing each other in the second direction II-II', there may be deposited the conductive layers 36A. Between each of the pillars 33 and each of the slits SL in the second direction II-II', there may not be deposited the conductive layers 36A. In this way, the conductive layers 36A may be filled in the openings OP, that is, in the space between the pillars 33. In this connection, the conductive layers 36A may be a metal. In one example, the metal may include tungsten W, tungsten nitride WNx, or the like.

Figure 9A:
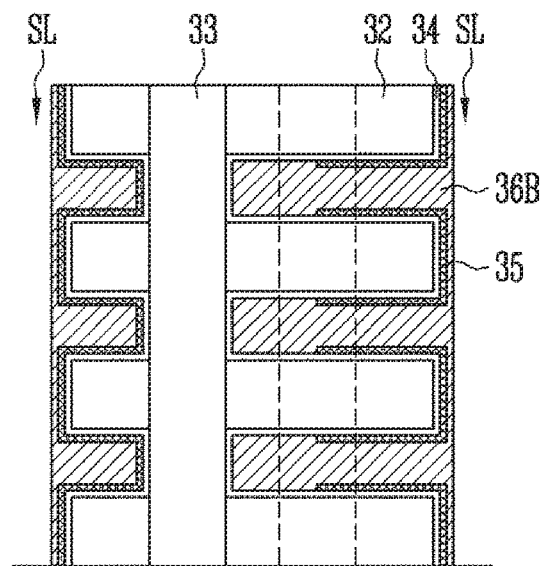
Figure 9B:
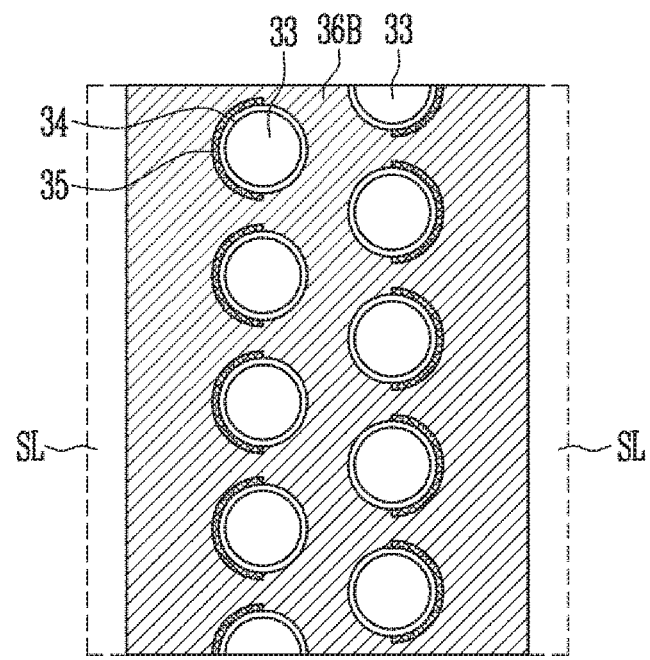

Referring to FIG. 9A and FIG. 9B, conductive layers 36B may be deposited to completely fill the openings OP. At this time, since a metal material may be deposited on the surface of the previously-formed conductive layers 36A, the conductive layers 36B may be formed on the deposition inhibiting layers 35 regions. Further, using a deposition process, the conductive layers 36B may be formed on an inner surface of the slit SL.

Figure 10A:
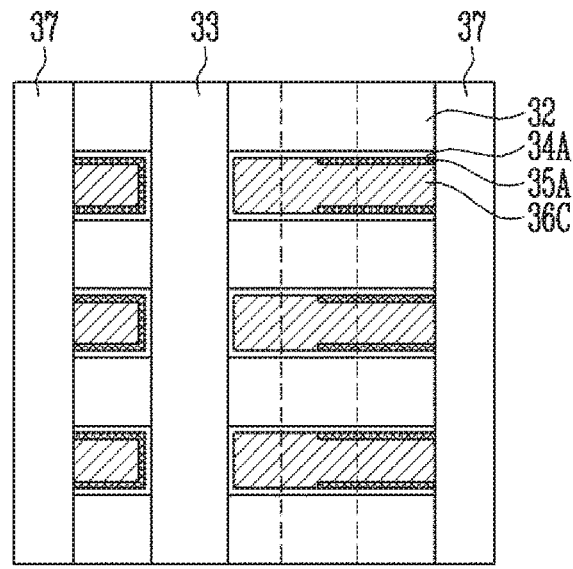
Figure 10B:
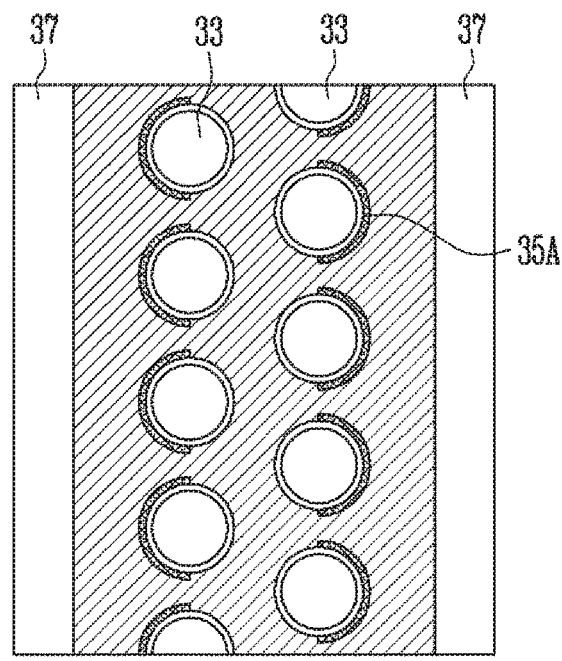

Referring to FIG. 10A and FIG. 10B, a removal of the barrier layer 34, deposition inhibiting layer 35, and conductive layers 36B in the slit SL may be carried out. Via this removal, inter-separated barrier patterns 34A, deposition inhibiting patterns 35A, and conductive patterns 36C may be formed. In this connection, each of the barrier patterns 34A may surround a side-wall of each of the pillars 33 and each of the insulating layers 32. Each of the deposition inhibiting patterns 35A may surround at least a portion of a side-wall of each of the pillars and may be disposed between each of the conductive patterns 36C and each of the insulating layers 32. Further, each of the conductive patterns 36C may surround each of the pillars 33. Each of the conductive patterns 36C may contact a portion of each of the barrier patterns 34A and may contact a portion of each of the deposition inhibiting patterns 35A.

Thereafter, a slit insulating layer 37 may fill the slits SL. The slit insulating layer 37 may include oxide. An air-gap may be formed in the slit insulating layer 37.

According to the above manufacturing method, since the conductive material may start to be deposited from a deep inner portion of each of the openings OP, there may result in compact conductive patterns 36C without voids. The compact conductive patterns 36C may serve as the gate electrode of the memory cell, selection transistor, etc. Since the compact conductive pattern 36C may be formed without a void, a memory cell, a selection transistor, etc. including the compact conductive pattern 36C can have a uniform property.

Figure 11A:
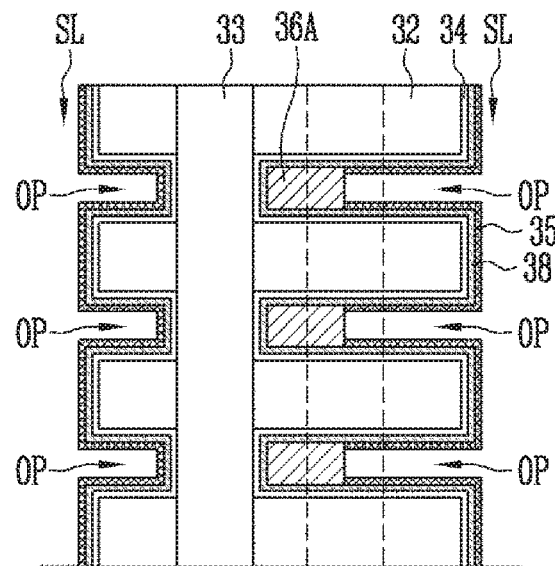
FIG. 11A, FIG. 11B, FIG. 12A and FIG. 12B illustrate a method of manufacturing a semiconductor device in accordance with one implementation of the present disclosure. Each of FIG. 11A to FIG. 12A illustrates a cross-sectional view. Each of FIG. 11B to FIG. 12B illustrates a plan view.
Figure 11B:
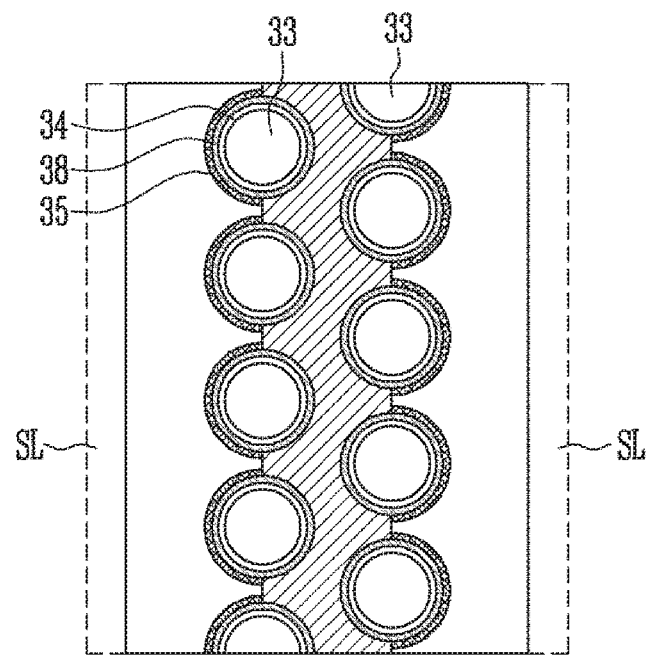
Figure 12A:
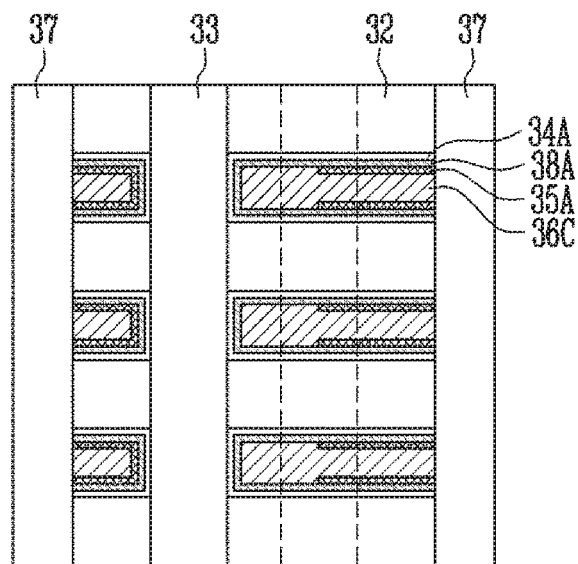
Figure 12B:
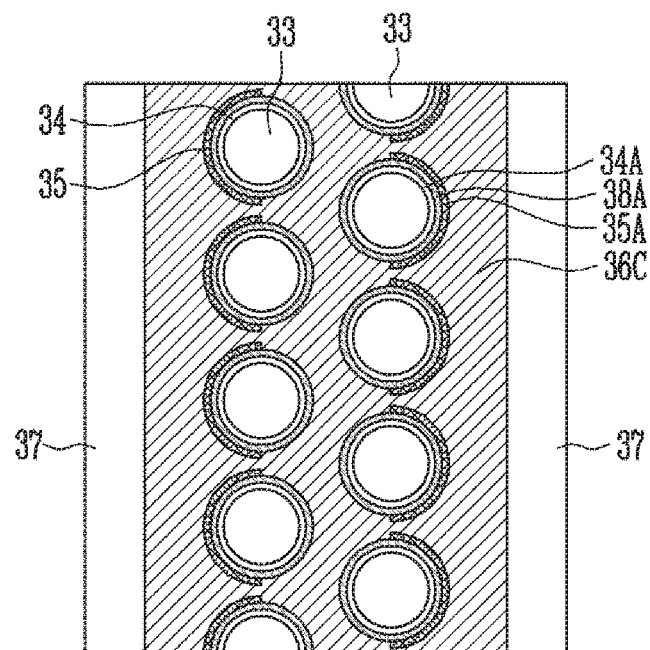

FIG. 11A, FIG. 11B, FIG. 12A and FIG. 12B illustrate a method for manufacturing the semiconductor device in accordance with one implementation of the present disclosure. Each of FIGS. 11A and 12A shows a cross-sectional view. Each of FIGS. 11B and 12B shows a plan view. Hereinafter, descriptions of the same or similar elements as described above may be omitted.

Referring to FIG. 11A and FIG. 11B, on each of the barrier layers 34, there may be formed each of seed layers 38. In this connection, the seed layer 38 may serve as a nucleation site for a subsequent conductive layer formation. At a nucleation site, the conductive layer may selectively grow from the seed layer 38. A portion of the seed layer 38 covered by the deposition inhibiting layer 35 may not contact a source gas, and, thus, the conductive layer may not grow from and on that portion. In this manner, a conductive layer growth location may be controlled.

The seed layer 38 may be made of the same material as a conductive layer which will be formed at a later stage. In one example, the seed layer 38 may include tungsten W, tungsten nitride WNx or the like. It may be noted that the barrier layers 34 may be omitted and only the seed layers 38 may be formed.

Thereafter, on the seed layer 38, there may be disposed a deposition inhibiting layer 35. In one example, when using a N2 plasma process, the deposition inhibiting layer 35 may be formed. As a result, the deposition inhibiting layer 35 including a tungsten nitride layer WNx may be formed on the seed layer 38. When an O2 plasma process is used, the deposition inhibiting layer 35 including a tungsten oxide layer WOx may be formed on the seed layer 38.

Next, the conductive layer 36A may be grown from and on the seed layer 38 exposed through the deposition inhibiting layer 35. Since the conductive layer 36A may be grown using the seed layer 38 as a nucleation site, the conductive layer 36A may not be grown on and from the deposition inhibiting layer 35.

Referring to FIG. 12A and FIG. 12B, conductive patterns 36C may be formed via the growth of the conductive layers 36A. When, the conductive patterns 36C are formed in this way, the conductive layer may be selectively grown in the openings OP. This may lead to a prevention of a bridge between the stacked conductive patterns 36C.

Next, the seed layers 38, deposition inhibiting layers 35, and barrier layers 34 are trimmed to form seed patterns 38A, deposition inhibiting patterns 35A, and barrier patterns 34A, respectively. It may be noted that when the conductive layers are formed in the slits SL, these conductive layers may be removed at the same time when the seed layers 38, deposition inhibiting layers 35, and barrier layers 34 are trimmed.

According to the above-mentioned process where, prior to the formation of the deposition inhibiting layer 35, the seed layer 38 may be formed and the conductive layers 36A may be effectively formed into the openings OP. Further, by controlling of the growth of the conductive patterns 36C only into the openings OP, a process of dividing a conductive pattern 36C is not necessary.

The present disclosure is not limited to this implementation, in which a method for manufacturing the semiconductor device is described above in connection with figures FIG. 1A to FIG. 1D. The number of the pillars 33, arrangements of the pillars 33, and/or a location of the deposition inhibiting layer 35 may have variations in other embodiments. In this connection, the semiconductor devices as above-mentioned in connection with FIG. 2A to FIG. 4C may be manufactured in accordance with principles of the present disclosure.

Figure 13:
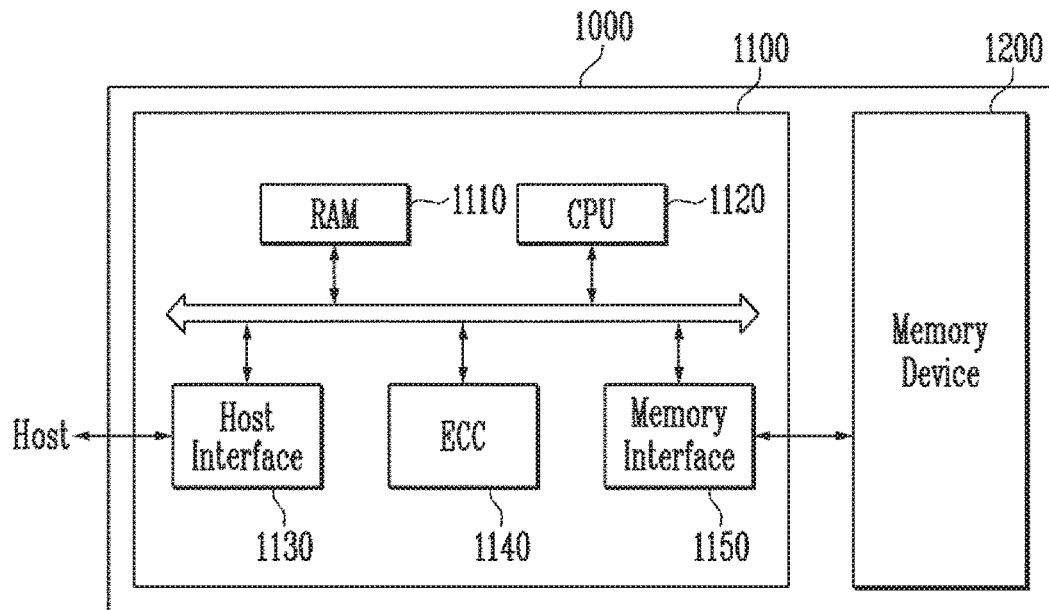
FIG. 13 illustrates a block diagram of a memory system in accordance with one implementation of the present disclosure.

FIG. 13 is a block diagram of a memory system in accordance with one implementation of the present disclosure. Referring to FIG. 13, a memory system 1000 in accordance with one implementation of the present disclosure may include memory device 1200 and controller 1100.

The memory device 1200 may be used to store data information in various types such as a text, graphic, software code, etc. The memory device 1200 may be implemented in a nonvolatile memory, and may include the configurations as above-addressed in connection to FIG. 1A to FIG. 12B. Further, the memory device 1200 may include first and second slit insulating layers, each slit insulating layer extending in a first direction; a stacked structure including conductive layers and insulating layers which are alternately stacked, and disposed between the first and second slit insulating layers, wherein the stacked structure includes first, second, and third regions, wherein the first region contacts the first slit insulating layer, wherein the second region contacts the second slit insulating layer, wherein the third region is defined between the first region and the second region; a plurality of first pillars arranged in the first direction, each first pillar passing through the first region of the stacked structure; a plurality of second pillars arranged in the first direction, each second pillar passing through the second region of the stacked structure; and a plurality of first deposition inhibiting patterns, each first deposition inhibiting pattern being disposed between each of the conductive layers and each of the insulating layers in the first region, each first deposition inhibiting pattern surrounding at least a portion of a side-wall of each of the first pillars. The memory device 1200 may have the same configuration and may be formed by the same manufacturing method as described above.

The controller 1100 may be coupled to a host and the memory device 1200, and may be configured to access the memory device 1200 in response to a request from the host. For example, the controller 1100 may be configured to control reading, writing, erasing, background operations of the memory device 1200, or the like.

The controller 1100 may include a RAM (Random Access Memory; 1110), CPU (Central Processing Unit; 1120), host interface 1130, ECC circuit (Error Correction Code Circuit; 1140), memory interface 1150 or the like.

In this connection, RAM 1110 may be employed as a work memory for the CPU 1120, as a cache memory between the memory device 1200 and host, as a buffer memory between the memory device 1200 and host, and so on. It may be noted that the RAM 1110 may be replaced with SRAM (Static Random Access Memory), ROM (Read Only Memory), etc.

The CPU 1120 may be configured to control all of operations of the controller 1100. In one example, the CPU 1120 may be configured to operate firmware such as Flash Translation Layer (FTL) stored in the RAM 1110.

The host interface 1130 may interface with the host. In one example, the controller 1100 may communicate with the host over at least one of various interface protocols such as USB (Universal Serial Bus) protocol, MMC (Multi-Media Card) protocol, PCI (Peripheral Component Interconnection) protocol, PCI-E (PCI-Express) protocol, ATA (Advanced Technology Attachment) protocol, Serial-ATA protocol, Parallel-ATA protocol, SCSI (Small Computer Small Interface) protocol, ESDI (Enhanced Small Disk Interface) protocol, and IDE (Integrated Drive Electronics) protocol, private protocol, or the like.

The error correction code block 1140 may be configured to detect and correct an error in data received from the semiconductor memory device 1200 using an error correction code ECC.

The memory interface 1150 may interface with the semiconductor memory device 1200. For example, the memory interface may include a NAND interface or a NOR interface.

It may be noted that the controller 1100 may further include a buffer memory (not shown) to temporarily store data. In this connection, the buffer memory may temporarily store data to be sent to an external device via the host interface 1130, or may temporarily store data to be sent from the memory device 120 via the memory interface 1150. Further, although not shown in the figure, the controller 1100 of the memory system according to the present disclosure may further include a ROM (not shown) to store code data to interface with the host system or host.

The memory system 1000 in accordance with one implementation of the present disclosure may include the memory device 1200 having a stable structure and an enhanced integration which may allow for an improved integration of the memory system 1000.

Figure 14:
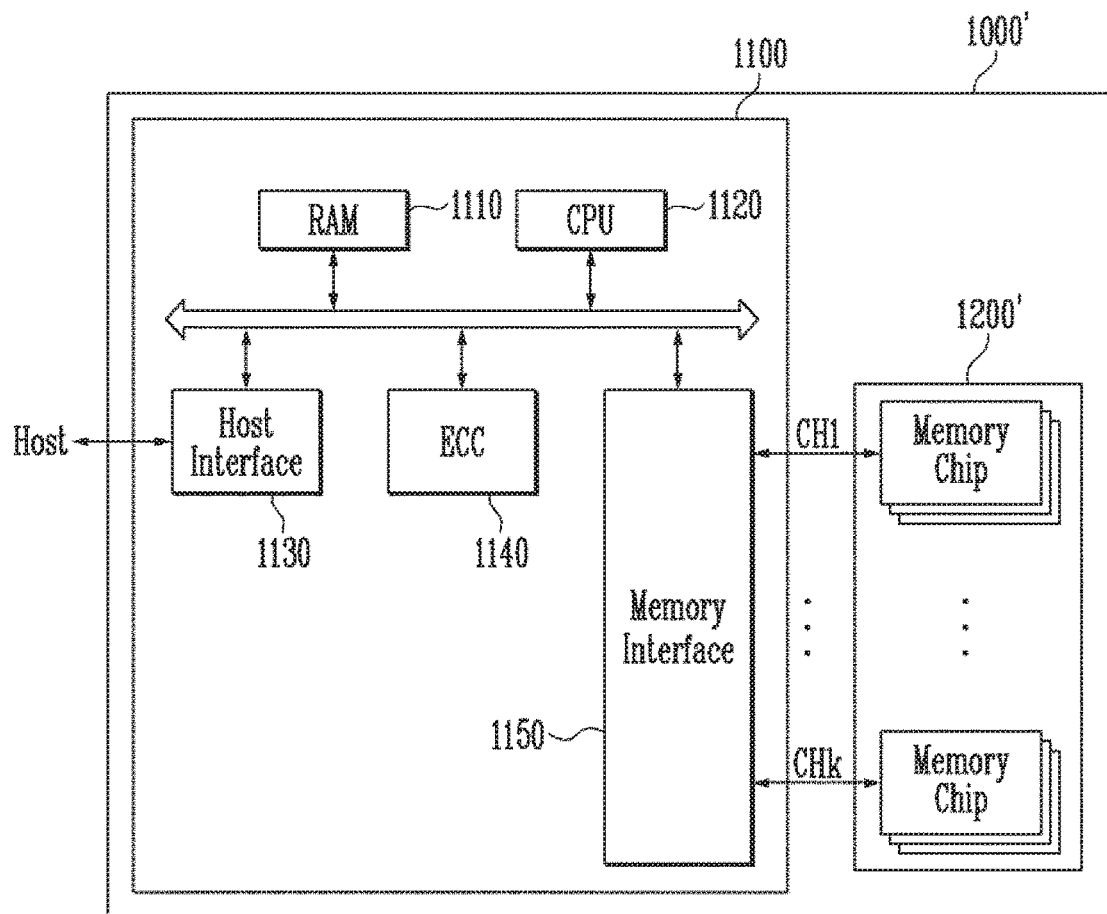
FIG. 14 illustrates a block diagram of a memory system in accordance with one implementation of the present disclosure.

FIG. 14 is a block diagram of a memory system in accordance with one implementation of the present disclosure. Hereinafter, description of the same or similar elements as mentioned in the previous description may be omitted.

As shown in FIG. 14, the memory system 1000' in accordance with one implementation of the present disclosure may include a memory device 1200' and controller 1100. Further, the controller 1100 may include a RAM 1110, CPU 1120, host interface 1130, ECC circuit 1140, memory interface 1150, or the like.

The memory device 1200' may be implemented in a nonvolatile memory and may include the configurations as referenced above in connection to figures FIG. 1A to FIG. 12B. Further, the memory device 1200' may include first and second slit insulating layers, each slit insulating layer extending in a first direction; a stacked structure including conductive layers and insulating layers which are alternately stacked, and disposed between the first and second slit insulating layers, wherein the stacked structure includes first, second, and third regions, wherein the first region contacts the first slit insulating layer, wherein the second region contacts the second slit insulating layer, wherein the third region is defined between the first region and the second region; a plurality of first pillars arranged in the first direction, each first pillar passing through the first region of the stacked structure; a plurality of second pillars arranged in the first direction, each second pillar passing through the second region of the stacked structure; and a plurality of first deposition inhibiting patterns, each first deposition inhibiting pattern being disposed between each of the conductive layers and each of the insulating layers in the first region, each first deposition inhibiting pattern surrounding at least a portion of a side-wall of each of the first pillars. The memory device 1200' may have the same configuration and may be formed using the same manufacturing method described above.

Further, the memory device 1200' may be implemented in a multi-chip package composed of a plurality of memory chips. The plurality of memory chips may be divided to a plurality of groups. The plurality of groups may communicate respectively via first to k-th channels CH1 to CHk with the controller 1100. Each group may be configured to communicate via a single common channel with the controller 1100. In another embodiment, a single channel may be assigned to a single memory chip.

The memory system 1000' in accordance with one implementation of the present disclosure may include the memory device 1200' with a stable structure and an enhanced integration which may allow for an improved integration of the memory system 1000'. By having the multi-chip package configuration of the memory device 1200', the memory system 1000' may have an increased data storage capacity, and a higher operation rate.

Figure 15:
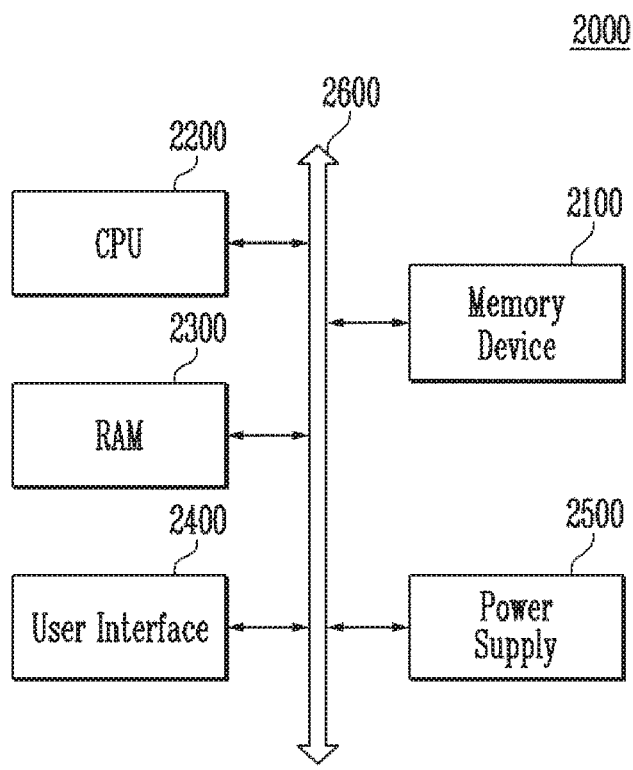
FIG. 15 illustrates a block diagram of a computing system in accordance with one implementation of the present disclosure.

FIG. 15 is a block diagram of a computing system in accordance with one implementation of the present disclosure. Hereinafter, description of the same or similar elements as described above may be omitted.

Referring to FIG. 15, a computing system 2000 in accordance with one implementation of the present disclosure may include a memory device 2100, CPU 2200, RAM 2300, user interface 2400, power-supply 2500, system bus 2600, or the like.

The memory device 2100 may store data supplied via the user interface 2400, data processed by the CPU 2200, or/and the like. Further, the memory device 2100 may be electrically coupled, via the system bus 2600, to the CPU 2200, RAM 2300, user interface 2400, power-supply 2500, etc. In one example, the memory device 2100 may be coupled via the controller (not shown) to the system bus 2600, or may be directly coupled to the system bus 2600. When the memory device 2100 is directly connected to the system bus 2600, the function of the controller may be carried out by the CPU 2200, RAM 2300 etc.

The memory device 2100 may be implemented in a nonvolatile memory and may include the configurations as described above in connection to figures FIG. 1A to FIG. 12B. Further, the memory device 2100 may include first and second slit insulating layers, each slit insulating layer extending in a first direction; a stacked structure including conductive layers and insulating layers which are alternately stacked, and disposed between the first and second slit insulating layers, wherein the stacked structure includes first, second, and third regions, wherein the first region contacts the first slit insulating layer, wherein the second region contacts the second slit insulating layer, wherein the third region is defined between the first region and the second region; a plurality of first pillars arranged in the first direction, each first pillar passing through the first region of the stacked structure; a plurality of second pillars arranged in the first direction, each second pillar passing through the second region of the stacked structure; and a plurality of first deposition inhibiting patterns, each first deposition inhibiting pattern being disposed between each of the conductive layers and each of the insulating layers in the first region, each first deposition inhibiting pattern surrounding at least a portion of a side-wall of each of the first pillars. The memory device 2100 may have the same configuration and may be formed using a manufacturing method as described above.

Further, the memory device 2100 may be implemented in a multi-chip package composed of a plurality of memory chips as in FIG. 14.

In one embodiment, the computing system 2000 may include a computer, UMPC (Ultra Mobile PC), workstation, net-book, PDA (Personal Digital Assistants), portable computer, web tablet, wireless phone, mobile phone, smart phone, e-book, PMP (portable multimedia player), portable game player, navigation device, black box, digital camera, 3-dimensional television, digital audio recorder, digital audio player, digital picture recorder, digital picture player, digital video recorder, digital video player, a device with a wireless data communication, at least one electronic device such as a home networking component, at least one electronic device such as a computer networking component, at least one electronic device such as a telematics networking component, a RIFD device, or the like.

The computing system 2000 in accordance with one implementation of the present disclosure may include the memory device 2100 having a stable structure and an enhanced integration which may allow for an improved integration of the computing system 2000. By having the multi-chip package configuration of the memory device 2100, the computing system 2000 may have an increased data storage capacity and a higher operation rate.

Figure 16:
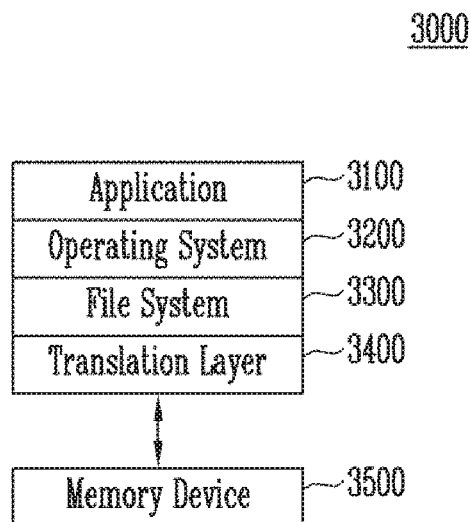
FIG. 16 illustrates a block diagram of a computing system in accordance with one implementation of the present disclosure.

FIG. 16 is a block diagram of a computing system in accordance with one implementation of the present disclosure. Referring to FIG. 16, a computing system 3000 in accordance with one implementation of the present disclosure may include a software layer such as an operating system 3200, application 3100, file system 3300, a translation layer 3400 or the like. Further, the computing system 3000 may include a hardware layer such as a memory device 3500, etc.

The operating system 3200 may be configured to manage software and/or hardware resources or the like of the computing system 3000 and may control a program execution via the CPU (central processing unit). The application 3100 may be implemented in various application programs executed in the computing system 3000, including utilities executed by the operating system 3200.

The file system 3300 may refer to a logical structure to manage data, file or the like present in the computing system 3000 and may organize files or data to be stored in the memory device 3500, etc. based on rules. The file system 3300 may be determined depending on the operating system 3200 running on the computing system 3000. In one example, when the operating system 3200 is implemented as a Windows series provided by Microsoft corporation, the file system 3300 may include FAT (File Allocation Table), NTFS (NT file system) etc. Otherwise, when the operating system 3200 is implemented as a Unix/Linux series, the file system 3300 may include an EXT (extended file system), UFS (Unix File System), JFS (Journaling File System) etc.

Although the operating system 3200, application 3100 and file system 3300 are shown in individual blocks respectively in this figure, the application 3100 and file system 3300 may be incorporated in the operating system 3200.

The translation layer 3400 may translate an address into a format compatible with the memory device 3500 in a response to a request from the file system 3300. In one example, the translation layer 3400 may translate a logical address generated from the file system 3300 to a physical address of the memory device 3500. In this connection, mappings between the logical address and physical address may be stored in an address translation table. In one example, the translation layer 3400 may be implemented as a Flash Translation Layer; FTL, Universal Flash Storage Link Layer, ULL, or the like.

The memory device 3500 may be implemented as a nonvolatile memory and may include the configurations as described above in connection to figures FIG. 1A to FIG. 12B. Further, the memory device 3500 may include first and second slit insulating layers, each slit insulating layer extending in a first direction; a stacked structure including conductive layers and insulating layers which are alternately stacked, and disposed between the first and second slit insulating layers, wherein the stacked structure includes first, second, and third regions, wherein the first region contacts the first slit insulating layer, wherein the second region contacts the second slit insulating layer, wherein the third region is defined between the first region and the second region; a plurality of first pillars arranged in the first direction, each first pillar passing through the first region of the stacked structure; a plurality of second pillars arranged in the first direction, each second pillar passing through the second region of the stacked structure; and a plurality of first deposition inhibiting patterns, each first deposition inhibiting pattern being disposed between each of the conductive layers and each of the insulating layers in the first region, each first deposition inhibiting pattern surrounding at least a portion of a side-wall of each of the first pillars. The memory device 3500 may have the same confirmation and may be formed using a manufacturing method as described above.

The computing system 3000 may be divided into an operation system layer corresponding to an upper level region and a controller layer corresponding to a lower level region. In this connection, the application 3100, operating system 3200 and file system 3300 may be defined in the operating system layer and may be associated with a work memory for the computing system 3000. Further, the translation layer 3400 may be defined either in the operating system layer or in the controller layer.

The computing system 3000 in accordance with one implementation of the present disclosure may include the memory device 3500 having a stable structure and an enhanced integration which may allow for an improved integration of the computing system 3000. Thus, the computing system 3000 may have an increased data storage capacity.

The above description is not limiting, but is made merely for the purpose of describing the general principles of exemplary embodiments, and many additional embodiments of this disclosure are possible. It is understood that no limitation of the scope of the disclosure is thereby intended. The scope of the disclosure should be determined with reference to the Claims. Reference throughout this specification to "one embodiment," "an embodiment," or similar language means that a particular feature, structure, or characteristic that is described in connection with the embodiment is included in at least one embodiment of the present disclosure. Thus, appearances of the phrases "in one embodiment," "in an embodiment," and similar language throughout this specification may, but do not necessarily, all refer to the same embodiment.

What is claimed is:

1. A semiconductor device comprising:
conductive layers and insulating layers, which are alternately stacked, wherein each of the conductive layers includes a first portion and a second portion;
first pillars, wherein each first pillar passes through the insulating layers and the first portion of each of the conductive layers;
second pillars, wherein each second pillar passes through the insulating layers and the second portion of each of the conductive layers; and
deposition inhibiting patterns, each deposition inhibiting pattern being disposed between each of the insulating layers and the first portion of each of the conductive layers to expose the second portion of each of the conductive layers, wherein the deposition inhibiting patterns are not disposed between adjacent first and second pillars,
wherein the second portion is thicker than the first portion in each of the conductive layers, and
wherein each of the conductive layers extends continuously from the first portion to the second portion.

2. The device of claim 1, wherein each of the deposition inhibiting patterns covers the first portion of each of the conductive layers and exposes the second portion of each of the conductive layers.

3. The device of claim 1, further comprising:
barrier patterns surrounding the conductive layers, respectively; and
seed patterns surrounding the conductive layers, respectively, wherein the seed patterns are interposed between the barrier patterns and the second portion of each of the conductive layers and between the barrier patterns and the deposition inhibiting patterns.

4. A semiconductor device comprising:
a first slit insulating layer;
a second slit insulating layer;
conductive layers stacked on top of each other and disposed between the first and second slit insulating layers, wherein each of the conductive layers includes first, second and third portions, wherein the first portion contacts the first slit insulating layer, the second portion contacts the second slit insulating layer, and the third portion is defined between the first portion and the second portion;
insulating layers alternately stacked with the conductive layers; and
deposition inhibiting patterns, each deposition inhibiting pattern surrounding the first and second portions of each of the conductive layers to expose the third portion of each of the conductive layers,
wherein the third portion is thicker than the first and second portions in each of the conductive layers, and
wherein each of the conductive layers extends continuously from the first portion and the second portion to the third portion.

5. The device of claim 4, wherein the first and second portions of each of the conductive layers contact the deposition inhibiting patterns.

6. The device of claim 4, further comprising:
barrier patterns surrounding the conductive layers, respectively; and
seed patterns surrounding the conductive layers, respectively, wherein the seed patterns are interposed between the barrier patterns and the second portion of each of the conductive layers and between the barrier patterns and the deposition inhibiting patterns.

7. The device of claim 1, wherein the first portion and the deposition inhibiting patterns are spaced apart from each of the first pillars and the second pillars by a same distance in a same level.

8. The device of claim 1, wherein the first portion overlaps the deposition inhibiting patterns in a direction in which the conductive layers and the insulating layers are stacked.

9. The device of claim 4, wherein the first portion and the second portion overlap the deposition inhibiting patterns in a direction in which the conductive layers are stacked.

\* \* \* \* \*